United States Patent [19]

Adachi

[11] Patent Number: 5,761,804
[45] Date of Patent: Jun. 9, 1998

[54] ELECTRONIC CIRCUIT AND A METHOD FOR FABRICATING THE ELECTRONIC CIRCUIT

[75] Inventor: Yoshio Adachi, Kodaira, Japan

[73] Assignee: AUE Co. Research Center, Tokyo, Japan

[21] Appl. No.: 546,220

[22] Filed: Oct. 20, 1995

[51] Int. Cl.$^6$ .................................................. H01R 43/00
[52] U.S. Cl. .................. 29/855; 264/272.11; 264/272.14; 264/272.15; 439/68
[58] Field of Search .............................. 29/855, 592.1; 264/272.11, 272.14, 272.15; 439/68

[56] References Cited

U.S. PATENT DOCUMENTS

| | | | |
|---|---|---|---|
| 3,805,117 | 4/1974 | Hausman | 439/68 X |
| 4,609,040 | 9/1986 | Moore | 165/80.3 |
| 5,097,592 | 3/1992 | Schultz, Jr. et al. | 29/855 X |
| 5,229,641 | 7/1993 | Katayama . | |

FOREIGN PATENT DOCUMENTS

| | | |
|---|---|---|
| 2137440 | 12/1972 | France . |
| 868877 | 5/1961 | United Kingdom . |
| 1198449 | 8/1967 | United Kingdom . |
| 1142620 | 2/1969 | United Kingdom . |

OTHER PUBLICATIONS

Patent Abstracts of Japan, vol. 17, No. 213 (E-1356) Apr. 26, 1993 & JP-A-04 350916 (EE YUU II Kenkiyuushiyo KK) 4 Dec. 1992.

Primary Examiner—Carl J. Arbes
Attorney, Agent, or Firm—Gottlieb, Rackman & Reisman, P.C.

[57] ABSTRACT

A method of assembling a shielded circuit of electronic components and loading them directly into a shell without arranging electronic components on a board. A hybridized electronic circuit, for example a rectifier circuit is made with a bottom shell formed from a transparent plastic, into which is loaded an electronic part. The bottom shell has a connector section as well as a slot which joins the terminals of the electronic components to a top shell also formed from the same plastic, and the various electronic components; the slots in the bottom shell is such that after the electronic component terminals are intersected they can be positioned; then after the electronic components are loaded, the top shell is placed as a cover, and the intersecting terminals as well as the electronic components are ultrasonically sealed at the same time.

3 Claims, 4 Drawing Sheets

ELECTRONIC CIRCUIT AND A METHOD FOR FABRICATING THE ELECTRONIC CIRCUIT

FIELD OF THE INVENTION

The present invention is concerned with the method of assembling an electronic circuit which can be packed in electronic devices used in various applications such as, for example, in rectifier circuits changing alternating current to direct current or in matching circuits controlling impedance; in further detail, it is concerned with constructing these circuits and the method of assembling the electronic circuit from a multitude of various electronic parts into a single hybridized part which attains a fixed objective such as a rectifier circuit.

BACKGROUND OF THE INVENTION

The assembly of electronic circuits using previous technology was to etch a pattern onto a prescribed size board by means of an electrically conductive material and on this printed wire board, a discrete part which is an electronic components of prescribed resistors and condensers is positioned and soldered.

Further, in recent years, the miniaturization of electronic devices has led to the development of SMT (Surface Mount Technology) in order to improve the mounting density and accomplish advances in functions. In SMT, chip parts such as resistance condensers made into chips are placed at high speed onto the printed wire boards by means of chip mounters and after melting the solder by thermal treatment and washing, the chip part is fixed to complete a desired board.

BRIEF DESCRIPTION OF THE INVENTION

However, in the method of assembling electronic components by means of the former technology explained above, there are problems in numbers of parts and the inability of simplifying the structure such as the necessity of connecting special wires to the board laid down with the printed wires or to the electronic components after they have been positioned.

Furthermore, there have been indications that producing such things as miniature boards equivalent to the considerable number of recent products would not be suitable since the assembly by means of SMT requires additional equipment for the basic use of the board, the cost of providing the equipment is extremely high, and there must be considerable demand for the products.

Furthermore, with regard to applying the printed wires on a board, the higher the density, the greater the problems from the design standpoint when such things as noise and cross-talk are considered.

Accordingly, it is necessary to solve the problems of the basic method of assembling electronic circuits by use of boards.

In order to solve the above-cited problems, the method of electronic circuit assembly related to this invention was conceived to produce a desired electronic circuit consisting of an electronic components-loaded bottom shell formed from an insulating plastic with slots to join the connector section and the terminals of the electronic components, a top shell formed from an insulating plastic to cover said bottom shell, and various electronic components. The aforementioned slotted section is set so that it can be positioned after terminals of the electronic components are intersected and then covered with the top shell after the electronic components are loaded; then the intersecting terminals of the various electronic components and the top and bottom shells are ultrasonically sealed simultaneously.

Furthermore, it is characterized by assembling a desired electronic circuit consisting of an electronic components-loaded bottom shell having slots to join the connector sections as well as the terminals of the electronic components, and the various electronic components loaded onto the said bottom shell or the top shell. The above-mentioned slots are such that the terminals of the electronic, components can be intersected and positioned. After the electronic components are positioned, the intersecting terminals of the various electronic components are ultrasonically sealed.

Again, the above-mentioned bottom shell as well as the top shell are formed from transparent or semi-transparent materials.

Furthermore, it concerns an electronic circuit characterized as consisting of an electronic components-loaded bottom shell formed from an insulating plastic having slots to join the connector sections as well as the terminals of the electronic components, a top shell formed from an insulating plastic covering the said bottom shell from above, and the various electronic components. The slots previously cited are such that the terminals of the electronic components can be positioned after being intersected. After the electronic components are loaded, the top shell is fitted and the intersecting terminals of the various electronic components and the top and bottom shells are ultrasonically sealed simultaneously.

Furthermore, it is an electronic circuit characterized as consisting of an electronic component-loaded bottom shell formed from insulating plastic having slots to join connector sections as well as the terminals of the electronic components, and various electronic components placed in the said bottom shell or the top shell. The previously mentioned slots are such that the terminals of the various electronic components can be positioned after being intersected, then after the electronic components are positioned, terminals of the various electronic components are joined ultrasonically.

The electronic circuit is a rectifier circuit.

Terminals of electronic components are mutually placed to intersect on a bottom shell formed from an insulating plastic and the positioning slots as well as the connector section of the parts are set and after the electronic components are loaded, the top shell is set on as the cover, the bottom shell is placed on a table and an ultrasonic horn is set on the top of the top shell then when an ultrasound wave is applied at the same time to the intersecting terminals as well as to the top and bottom shells, the various terminals are electrically connected by the minute vibrations. Furthermore, the top and bottom shells are also sealed. By this means a component-prescribed circuit such as a hybrid rectifier circuit can be obtained without the necessity of boards or the necessity of shielding the assembled product with specially wired special product. In this case, plans can be made of possibly someday omitting one of the shells, of thin-sizing, and down-costing.

DETAILED DESCRIPTION OF A PREFERRED EMBODIMENT

The method of assembling an electronic circuit constituting a preferred circuit of this invention, namely a rectifier circuit, as an example, will be explained in detail with references to the figures.

Figure 1:
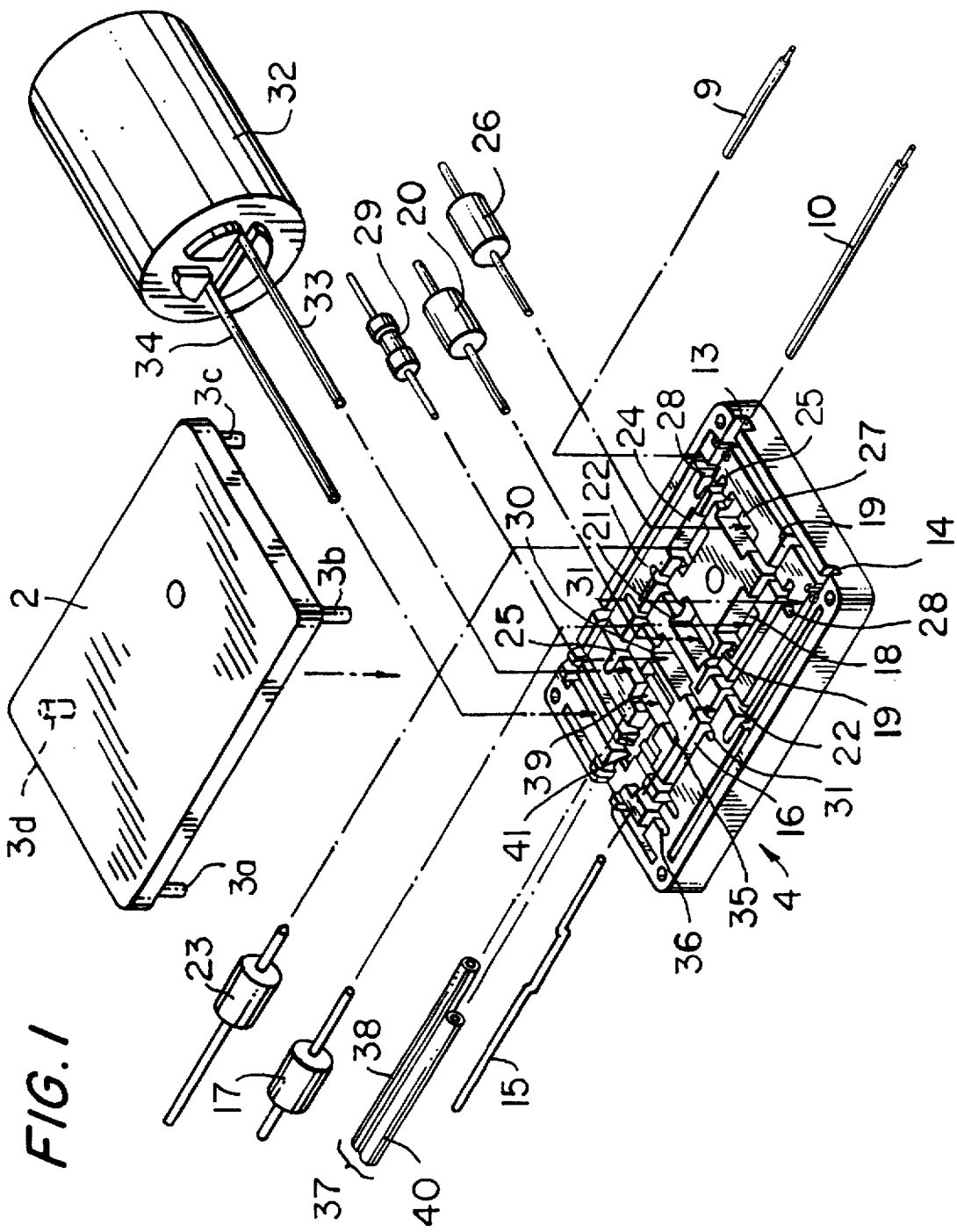
FIG. 1. An exploded view of the electronic components assembly of the present invention.

The rectifier circuit with various hybridized parts as an example of a circuit shown in FIG. 1 is constructed from the top and bottom shells 2, 4; the alternating current input terminal 9, 10; lead wire 15; the 1st–4th diodes 17, 20, 23, 26; the resistor 29 and the direct current output terminal 37.

Figure 2:
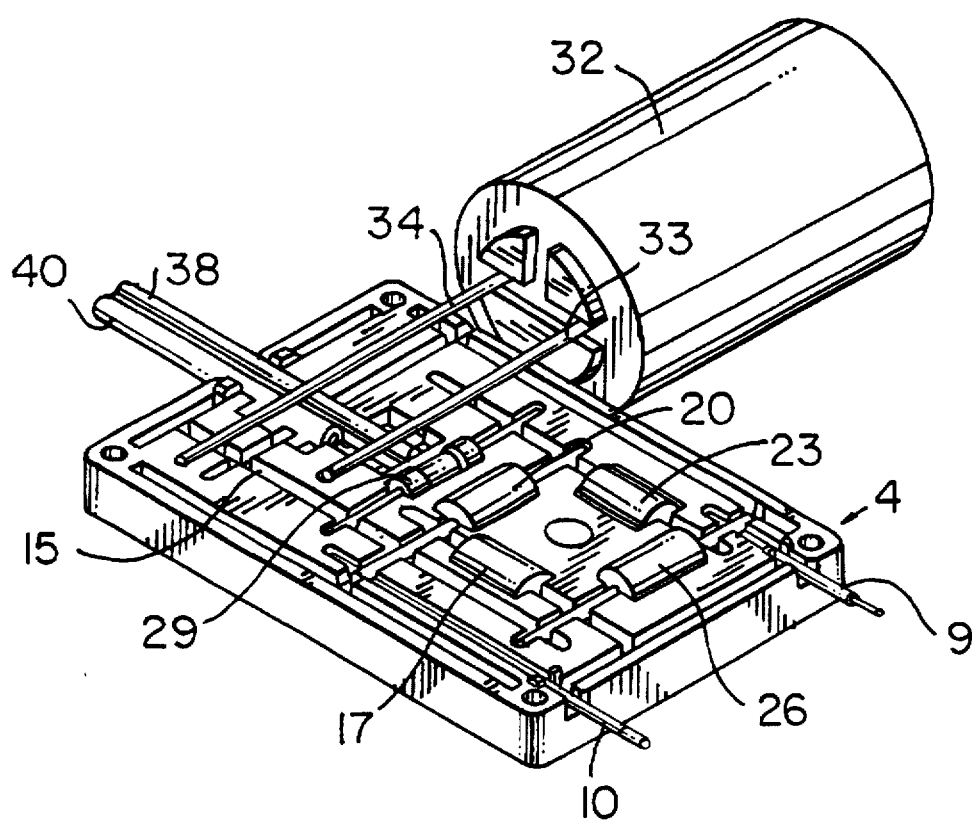
FIG. 2. An oblique view of electronic components loaded into the bottom shell related to the present invention.

The top shell 2, shown in FIG. 2, is formed from an insulating plastic having a rectangular shape which is joined to the bottom shell 4 made from a supersonically sealable plastic. The top shell is constructed with connecting posts 3a, 3b, 3c, 3d to connect with the four corners of the bottom shell 4.

The bottom shell 4 is formed (as is the top shell 2) into a rectangular shape from insulating plastic, creating a component connecting section having terminal slots. A circuit is formed by loading this with electronic components prepared with lead terminals constituting the rectifier circuit. It is desirable to use transparent or semi-transparent materials for these top and bottom shells 2, 4. After assembly the inner components can be viewed from the exterior and can serve as instructional material for children.

Figure 4:
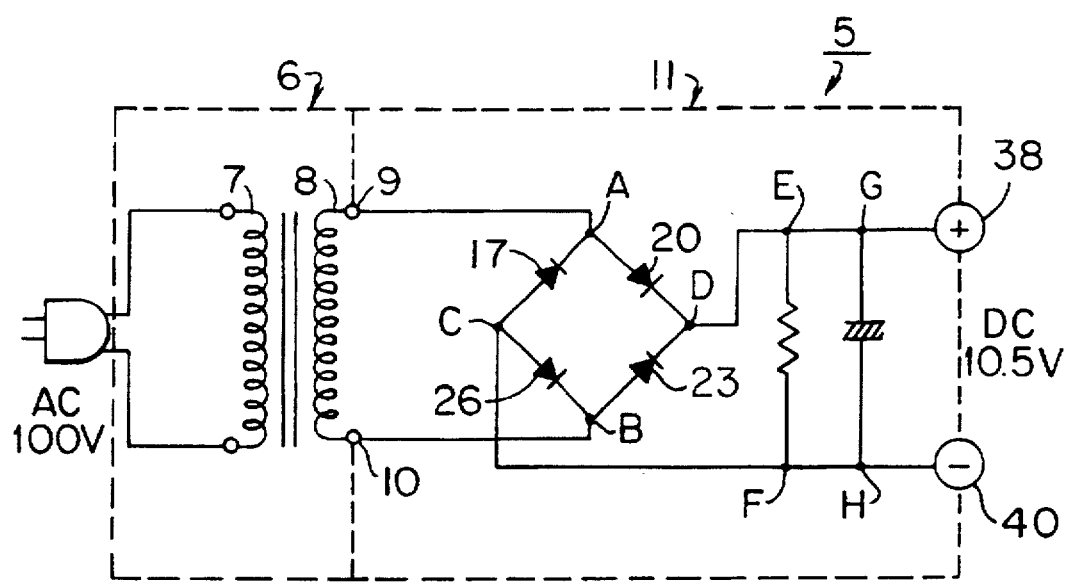
FIG. 4. Circuit diagram of the rectifier circuit assembly from the electronic components related to the present invention.

First, the rectifier circuit 5, shown in FIG. 4, consists of the transformer section 6 and the rectifier circuit section 11. In use, an alternating voltage of AC 100V is applied to the primary coil 7 and from mutual induction, the secondary coil 8 gives rise to an alternating current voltage of approximately AC 10V at the first and second alternating input terminals 9, 10.

In the rectifier circuit section 11, the alternating voltage from the first and second alternating voltage input terminals 9, 10 attached to the transformer section 6 is input from the A contact and B contact bridged by the first to the fourth diodes 17, 20, 23, 26 and a direct voltage is taken from the C contact and D contact which are the exit sides of the rectified current; a guard resistor 29 is inserted in parallel between the E contact and the F contact; a smoothing condenser 32 is inserted in parallel between the G contact and the H contact and a direct current voltage of DC 10.5V is obtained from the direct current output terminals 38, 40.

The preferred embodiment is, of course, not limited to the rectifier circuit 5 but a variety of equivalent circuits formed from electronic components are the objectives and the rectified output voltage is not limited to DC 10.5V.

Figure 3:
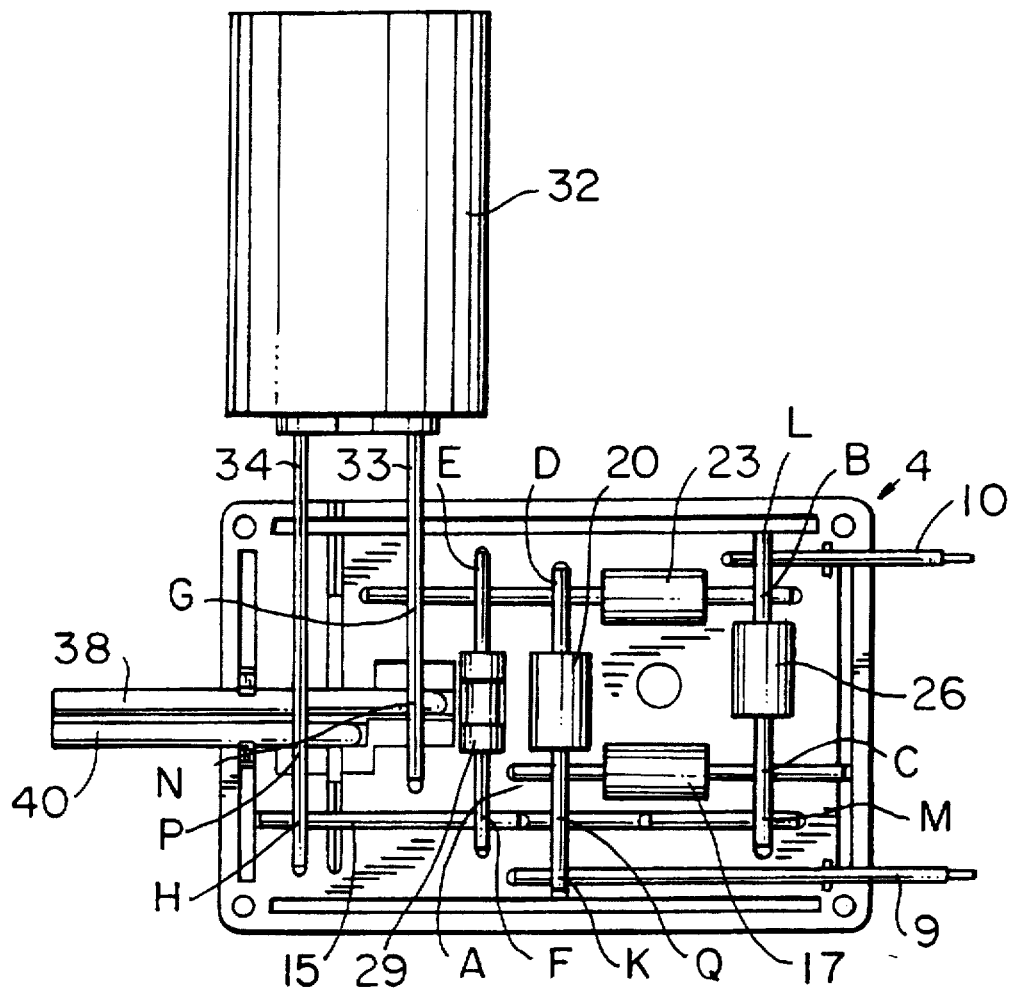
FIG. 3. A planar view of electronic components loaded into the bottom shell related to the present invention.

The bottom shell 12 shown in FIG. 1, FIG. 2 and FIG. 3, is formed into a structure comprising the connectors of the first to fourth diodes 17, 20, 23, 26, the resistor 29 constituting the rectifier circuit section 11, as explained above, as well as their terminals and the terminals of the smoothing condenser 32, and the slot formed through which the lead 15 enters. In the following, the structure of the components connector section as well as the slot section will be explained.

The first alternating current input terminal slot 13 and the second alternating current input terminal slot 14 which joins the first and second alternating current input terminals 9, 10 are placed in position from the right edge of the bottom shell 12 and parallel to the length of the bottom shell 12 as shown in FIG. 1 and FIG. 3.

The lead wire slot 16 which joins the lead wire 15, as shown in FIG. 1 and FIG. 3, is between the first and second alternating current input terminals 13, 14, is positioned adjacent to the second alternating current input slot 14 and, moreover, is placed parallel to it; and is constructed to intersect Point M, Point F, Point H of FIG. 3) the slot 28 for the terminal of the fourth diode 26, the slot 31 for the terminal of the resistor 29 and the slot 32 for negative side terminal of the smoothing condenser 32.

The part connecting the first diode 17 is, as shown in FIG. 1 as well as FIG. 3, constructed in parallel with the slot 14 for the second input terminal and the lead wire slot 16; moreover, is placed with the slot 19 for the first diode terminal which intersects (Point A,Point C of FIG. 3) the first diode connector section 18 placed parallel and adjacent to the lead wire terminal slot 16, the terminal slot 22 for both ends of the second diode 20 and the slot 28 for the fourth diode 26.

The part connecting the second diode 20, shown in FIG. 1 and FIG. 3, is structured so that it is positioned nearly at the center of the bottom shell 4 and intersects the second diode connector 21 positioned parallel to the short direction and on one end the terminal slot 23 of the third diode (Point D of FIG. 3); the other end is provided with the second diode terminal slot 22 which intersects the terminal slot 19 of first diode 17 as well as the slot 13 of the first alternating current input terminal (Point A, Point K of FIG. 3).

The part connecting the third diode 23, shown in FIG. 1 as well as FIG. 3, is structured to intersect the second alternating current input terminal slot 14, the connector section 18 of the first diode, the third diode connector section 24 located adjacent to the second alternating current input terminal 14, and the one side intersects the second alternating current input terminal 22, the terminal slot 31 of the resistor 29, and the plus side slot 35 of the smoothing condenser 32 (Point D, Point E, Point G of FIG. 3); and the other side is provided with terminal slot 25 which intersects the terminal slot 28 of the fourth diode 26 (Point B of FIG. 3).

The part which joins the fourth diode 26, shown in FIG. 1 and FIG. 3, is structured so that it is positioned adjacent to, directly joins with, points to the second alternating current input terminal slots 13, 14 on the bottom shell, and intersects the fourth diode connector section 27 and on one end the terminal, slot 25 of the third diode 23 as well as the second alternating current input terminal slot 14 (Point B, Point L of FIG. 3); the other end is provided with the fourth diode terminal slot 28 which intersects the terminal slot 19 of the first diode 17 as well as the lead wire terminal slot 16 (Point C, Point M of FIG. 3).

The part which connects the resistor 29, shown in FIG. 1 as well as FIG. 3, is structured so that it is positioned parallel to the second diode connector section 21 and the resistor connector section 30 on the outside and where one end intersects the terminal slot 25 of the third diode (Point E of FIG. 3); the other end is provided with the resistor terminal slot 31 which intersects (Point F of FIG. 3) the lead wire terminal slot 16.

The part which connects the terminals 33, 34 of the plus side as well as the minus side of the smoothing condenser 32, shown in FIG. 1 as well as FIG. 3, is the left side part of the bottom shell of FIG. 3 and is structured such that it is positioned parallel to the short side; the plus side terminal 33 intersects (Point G, Point P of FIG. 3) the third diode terminal slot 25 as well as the plus side direct current output slot 41; and the minus side terminal 34 is Positioned parallel to the plus side terminal slot 35 as well as the minus side terminal slot 36 which intersect (Point P, Point H of FIG. 3) the minus direct current output terminal slot 41 as well as the lead wire terminal slot 16.

The part which connects the direct current output terminal 37, shown in FIG. 1 and FIG. 3, is structured so that it is positioned at approximately the middle of the left edge of the bottom shell 4 and parallel to the short direction; and set so that the terminal slot 39 which connects the plus direct current output terminal 38 intersects (Point N of FIG. 3) the plus side terminal slot 35 of the smoothing condenser 32, and the terminal slot 41 which connects the minus direct current output terminal 40 intersects (Point P of *FIG. 36) the minus side terminal slot 36 of the smoothing condenser 32.

The loading of various parts on the bottom shell 4 prepared with such part connecting sections as well as slots as shown in FIG. 2 is completed by first connecting the first and second alternating current input terminals 9, 10; next connecting the lead wire 15; next connecting the direct current output terminal 37; next connecting the first diode 17; next connecting the third diode 23; next connecting the resistor 29; next connecting the second diode 20; and next connecting the fourth diode 26.

The order of loading the parts is not limited to the order mentioned above, the key is that it is sufficient that Point A–Point H, Point J–Point N, Point P are connected shown in FIG. 3. A point where contact must not occur although intersecting is, for example, at Point Q of FIG. 3 as shown in FIG. 1, bending the midpoint of the lead wire side, the terminal of the second diode 20 is prevented from contact.

The bottom shell 4 assembled with the various sections constituting the rectifier circuit 5 is covered from the top with bottom shell 2. With regard to the covering of top shell 2, the positions of intersecting terminals (Point A–Point H, Point J–Point N, Point P) come into contact lightly when pushed or when under pressure contact.

Under these conditions, the top and bottom shells 2, 4 formed from transparent plastics such as polystyrene, polyethylene, polyamide as well as the intersecting terminals which are in contact formed from electrically conducting metals such as copper can be made into junctions by application of ultrasonic frequency and sealing with their vibrations. That is to say, the various parts are sealed by the top and bottom shells 2I 4; and, moreover, the part where the terminals are intersecting becomes an electrical junction (Point A–Point H, Point J–Point N, Point P of FIG. 3) is completed as a unitized rectifier circuit.

Even with the vinyl covering on the terminals, the vinyl covering is melted during ultrasonic sealing and the electrically conducting materials can be formed into junctions. Furthermore, when the terminals are not to be connected, it is sufficient to bend one of the terminals and to position the other terminal so that there is no contact.

Although the above-cited example was explained for the case where electronic components were placed in the bottom shell 4 and top shell 2, it is also possible to build an assembly with only one of the shells and ultrasonically sealing it.

As explained above, the method of assembling electronic components related to this invention where within the top and bottom shells, formed from a transparent plastic, is loaded with electronic components whose terminals have been intersected in the lower shell, the bottom shell is covered from the top, the intersecting terminal parts are pressed together with the top shell and these together with the top and bottom shells are joined by ultrasonic sealing and by this means without the use of boards the number of parts are reduced and the assembly is simplified; moreover, along with reducing the size, it is possible to tightly seal the electronic components in the top and bottom shells; and hybrid circuits whose shielded, stable operation are maintainable for example, a rectifier circuit can be built and extremely superior results are reported (as a result of this invention). Furthermore, when the top and bottom shells are made from transparent or semi-transparent material, the circuit of the electronic components within are recognizable resulting in teaching material for educational purposes. Furthermore, circuits can be assembled with only one of the top or bottom shells and in this case, planning for thin-sizing can be made, and moreover, the number of parts can be reduced and down-costing can be planned.

What is claimed is:

1. A method of fabricating an electronic circuit characterized by various electronic components comprising fabricating a bottom shell from an insulating plastic having slots to join connector sections and the terminals of the electronic components;

setting the various electronic components on said bottom shell forming a top shell from an insulating plastic;

covering the said bottom shell with said top shell;

positioning intersecting terminals of the electronic components and forming the desired electronic circuit by simultaneously sealing the intersecting terminals of the various electronic components and the top and bottom shells ultrasonically.

2. The method of assembling an electronic circuit of claim 1 characterized by the fact that the above-mentioned bottom shell as well as the top shell are made from transparent or semi-transparent materials.

3. The method of fabricating an electronic circuit characterized by an insulating plastic top shell as well as an electronic components loaded bottom shell having slots to join the connector sections and the terminals of the electronic components and the various electronic components loaded onto the said bottom shell or the top shell; said slots are set so that it is possible to intersect the terminals of the electronic components and after positioning the electronic components, ultrasonically joining the intersecting terminals of the various electronic components and thereby forming the desired electronic circuit.

* * * * *